United States Patent
Drevon et al.

[11] Patent Number: 5,905,635
[45] Date of Patent: May 18, 1999

[54] MULTI-LEVEL ELECTRONIC MODULE ASSEMBLY

[75] Inventors: Claude Drevon, Toulouse; Jean-Jacques Belin, Tournefeuille, both of France

[73] Assignee: Alcatel Alsthom Compagnie Generale D'Electricite, Paris, France

[21] Appl. No.: 08/972,889

[22] Filed: Nov. 18, 1997

[30] Foreign Application Priority Data

Nov. 21, 1996 [FR] France .................................. 96 14208

[51] Int. Cl.$^6$ ....................................................... H05K 7/20
[52] U.S. Cl. ......................... 361/704; 361/704; 361/735; 361/756; 361/790; 165/104.33; 165/80.3; 257/722; 343/853
[58] Field of Search ...................................... 361/688, 689, 361/699, 700–707, 719, 735, 756, 790, 717, 708, 721; 165/80.3, 80.4, 104.21, 104.26, 104.33, 104.14, 185; 257/700, 707, 718, 722, 724, 706, 720, 714; 174/252, 15.1; 62/150; 343/700 MS, 853, 856; 29/830; 438/109; 428/137

[56] References Cited

U.S. PATENT DOCUMENTS

| 4,283,754 | 8/1981 | Parks . |
| 5,128,689 | 7/1992 | Wong et al. ............................. 343/853 |
| 5,649,310 | 7/1997 | Tyner et al. ............................ 455/129 |

FOREIGN PATENT DOCUMENTS

| 0706219A1 | 4/1996 | European Pat. Off. . |
| 2688629A1 | 9/1993 | France . |
| WO9413121 | 6/1994 | WIPO . |

*Primary Examiner*—Leo P. Picard
*Assistant Examiner*—Michael Datskovsky
*Attorney, Agent, or Firm*—Sughrue, Mion, Zinn, Macpeak & Seas, PLLC

[57] ABSTRACT

An assembly of electronic modules comprises electronic modules supported by a support structure. Each electronic module is in the form of electronic components stacked on at least two levels which are separated by an intermediate layer. Each electronic module comprises at least one hole formed in the intermediate layer. The support structure comprises at least one rod element that is introduced into respective holes of successive modules.

8 Claims, 1 Drawing Sheet

MULTI-LEVEL ELECTRONIC MODULE ASSEMBLY

BACKGROUND OF THE INVENTION

1. Field of the Invention

The present invention concerns an assembly of electronic modules. This assembly comprises a plurality of electronic modules supported by a support structure.

2. Description of the Prior Art

Each electronic module is in the form of electronic components stacked on at least two levels which are separated by an intermediate dielectric layer. By way of non-limiting example, American patent U.S. Pat. No. 5,309,122 and U.S. patent application Ser. No. 08/825,956 each propose a particular type of electronic module.

American patent U.S. Pat. No. 4,987,425 proposes an assembly of electronic modules forming an antenna with radiating elements. The assembly uses a support structure made from a carbon fibre material that is metalized on its surface to assure a shielding and heat evacuation function. This support structure defines a plurality of individual cells disposed in a matrix in the manner of "honeycomb". The electronic modules are disposed inside these cells. On its upper surface the support structure supports an antenna body to which radiating elements are fixed. Each radiating element radiates in response to receiving an output signal produced by an electronic module. The lower surface of the support structure defines a base supporting conductive connecting elements adapted to apply input signals to the electronic modules.

A first disadvantage of the assembly described in this American patent U.S. Pat. No. 4,987,425 is the use of a relatively bulky support structure. Moreover, reducing the weight of the support structure implies the use of a carbon fiber material that is covered with a metallic layer. This metalization step makes the manufacture of the support structure more difficult. Moreover, the evacuation of the heat produced by the electronic modules is not optimal.

A first object of the invention is to provide an assembly of electronic modules in which the support structure is less bulky and simpler to manufacture than in the prior art. Another object of the invention is to offer an assembly offering better heat evacuation than in the prior art.

SUMMARY OF THE INVENTION

To this end, an assembly of electronic modules in accordance with the invention comprises a plurality of electronic modules supported by a support structure wherein each of said electronic modules is in the form of electronic components stacked on at least two levels which are separated by an intermediate layer, said electronic modules each comprises at least one hole formed in said intermediate layer, and said support structure comprises at least one rod element that is introduced into respective holes of successive modules.

In one embodiment the at least one rod element is rectilinear and is introduced into respective holes of aligned successive modules.

In another embodiment each module element includes two orthogonal holes, said modules are disposed in a matrix, and at least a first rod element is introduced into respective successive holes of electronic modules disposed in a line and at least one second rod element is introduced into respective successive holes of electronic modules disposed in a column.

The rod elements can support module separator plate elements. These plate elements assure electromagnetic shielding between components.

The rod elements are advantageously made from a material having a high thermal conductivity.

Other features and advantages of the present invention will emerge more clearly from a reading of the following description given with reference to the corresponding accompanying drawings.

DETAILED DESCRIPTION OF THE PREFERRED EMBODIMENT

Figure 1:
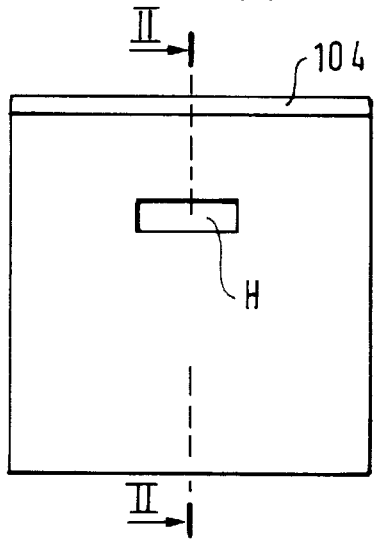
FIG. 1 is a perspective view of an electronic module of the invention.
Figure 2:
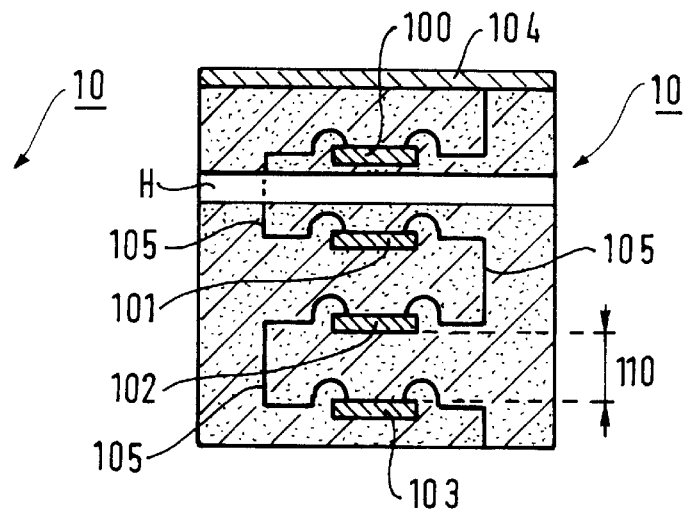
FIG. 2 is a sectional view of the module from FIG. 1.

Referring to FIGS. 1 and 2, a multi-level electronic module 10 is in the form of electronic components 100, 101, 102 and 103 stacked on at least two levels. Two electronic components, for example, 102 and 103, at two respective levels are separated by an intermediate layer 110 typically of a dielectric material. If the assembly is intended to form part of an active antenna a radiating element 104 can be fixed to one face of the electronic module 10. Components at different levels are connected by connecting means 105. A connection is made by a coplanar line such as that described in U.S. patent application Ser. No. 08/825,956, for example, a metalized via, etc.

In accordance with the invention, each module of the assembly includes at least one hole H formed in a dielectric intermediate layer 110. This hole H does not cross any connection 105 (see FIG. 2). As will become clear in what follows, in the case of a module at one end of the assembly the hole H can be a blind hole; elsewhere this hole typically passed completely through the module 1.

Figure 3:
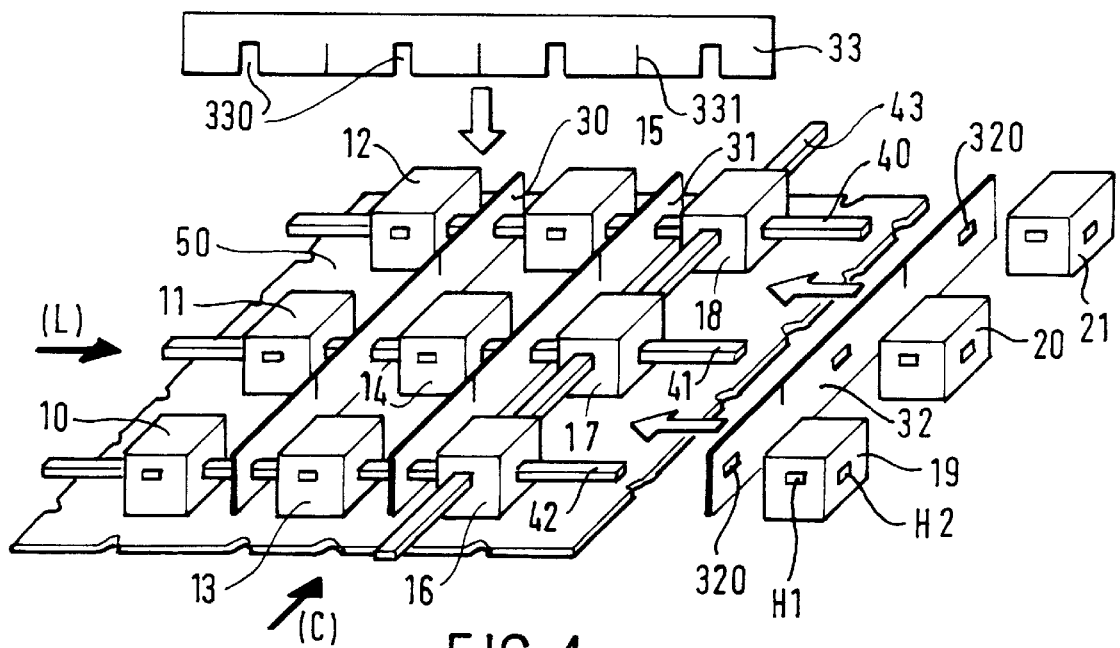
FIG. 3 is an exploded view of an electronic module assembly in one embodiment of the invention.

Referring to FIG. 3, in accordance with the invention, the support structure comprises at least one rod element, for example the rod element 40, which is introduced into the respective holes H of successive modules. For the rod element 40 these modules are designated 12, 15 and 18. It is feasible for the assembly to comprises only electronic modules disposed in a line. In this case a single rod element is provided. The rod element is rectilinear and is introduced into the respective holes of the successive modules, which are aligned. The assembly typically comprises a printed circuit 50 receiving one face of each of the modules.

In practice, for active antenna applications, the modules are disposed in a matrix, as shown in FIG. 3. In this case, each module 10 through 21 comprises two holes H1 and H2 on respective orthogonal axes and offset relative to each other. The two holes are disposed so that they do not cross any connection 105 and do not cross each other. First rod elements 40, 41 and 42 are each introduced into respective successive holes of electronic modules disposed in a line (L) 12-15-18, 11-14-17 and 10-13-16 and second rod elements 43 are each introduced into respective successive holes of electronic modules disposed in a column (C) 16-17-18.

Separator and shielding plate elements 30, 31, 32 and 33 can advantageously be provided to isolate each given module electromagnetically from the adjacent module(s). To this end, the separator and shielding plate elements 30, 31, 32 and 33 are each provided with slot(s) and/or hole(s) for fixing them to the rod elements 40, 41, 42 and 43. In the embodiment shown in FIG. 3, each column separator plate 30, 31 and 32 has N=3 holes 320 respectively adapted to receive the N first rod elements 40, 41 and 42. Each first rod element, for example element 40, therefore passes in succession through a hole H2 of a module 18, a hole 320 of a separator plate 31, a hole H2 of a module 15, and so on. Furthermore, each line separator plate 33 is provided with slots 330, 331 into each of which an edge of a second rod element 43 and/or a column separator plate 30, 31 and 32 is introduced.

For maximal evacuation of heat generated by the component(s) of each module, each rod elements 40, 41, 42 and 43 acts as a heatsink. To this end, the rod elements are advantageously made from a material having a high thermal conductivity. Furthermore, as an alternative to this, all the rod elements 40, 41, 42 and 43 are hollow and are connected to a heat evacuation system (not shown). This heat evacuation system circulates a heat exchange fluid in the rod elements 40, 41, 42 and 43.

Figure 4:
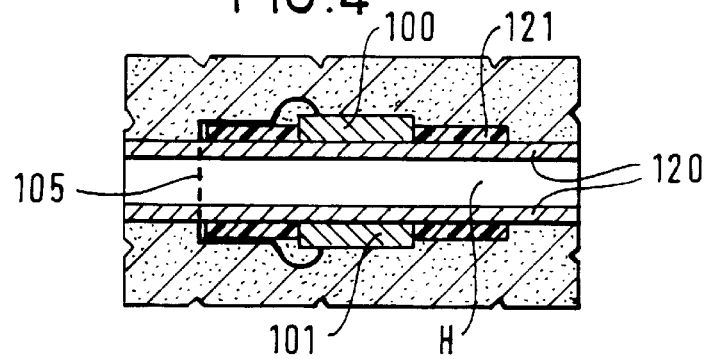
FIG. 4 is a fragmentary sectional view of an electronic module in one embodiment of the invention.

As shown in FIG. 4, for two levels of electronic components 100 and 101, the components on these two levels can be mounted on a dissipative material 120 having high thermal conductivity. The printed circuit 50 is typically made from this material, for example. This material 120 therefore delimits two faces of the hole H receiving a rod element. The rod element is mounted in this hole H in contact with the material 120 so as to optimise heat evacuation.

The invention described hereinabove applies to radiating antennas, for example.

There is claimed:

1. An assembly of electronic modules comprising a plurality of electronic modules supported by a support structure wherein each of said electronic modules is in the form of electronic components stacked on at least two levels which are separated by an intermediate layer, said electronic modules each comprise at least one hole formed in said intermediate layer, and said support structure comprises at least one rod element that is introduced into respective holes of successive modules.

2. The assembly claimed in claim 1 wherein at least one rod element is rectilinear and is introduced into respective holes of successive modules, which are aligned.

3. The assembly claimed in claim 2 wherein each module element includes two orthogonal holes, said modules are disposed in a matrix, and at least one first rod element is introduced into respective successive holes of electronic modules disposed in a line and at least one second rod element is introduced into respective successive holes of electronic modules disposed in a column.

4. The assembly claimed in claim 3 wherein said rod elements support module separator plate elements.

5. The assembly claimed in claim 1 wherein said rod elements are made from a material having a high thermal conductivity.

6. The assembly claimed in claim 1 wherein said rod elements are hollow to receive a heat exchange fluid.

7. The assembly claimed in claim 5 wherein said electronic components stacked on said two levels are each mounted on a material having a high thermal conductivity which delimits at least in part said hole receiving said rod element.

8. An antenna comprising an assembly as claimed in claim 1.

* * * * *